United States Patent
Kim et al.

(10) Patent No.: US 9,753,367 B2
(45) Date of Patent: Sep. 5, 2017

(54) METHODS OF FABRICATING PELLICLES USING SUPPORTING LAYER

(71) Applicant: Samsung Electronics Co., Ltd., Suwon-si, Gyeonggi-do (KR)

(72) Inventors: Munja Kim, Suwon-si (KR); Ji-Beom Yoo, Seoul (KR); Sooyoung Kim, Suwon-si (KR); Taesung Kim, Suwon-si (KR); Dong-Wook Shin, Changwon-si (KR); Hwanchul Jeon, Seoul (KR); Seul-Gi Kim, Suwon-si (KR)

(73) Assignees: Samsung Electronics Co., Ltd., Gyeonggi-do (KR); Research & Business Foundation Sungkyunkwan University, Gyeonggi-do (KR)

( * ) Notice: Subject to any disclaimer, the term of this patent is extended or adjusted under 35 U.S.C. 154(b) by 0 days.

(21) Appl. No.: 14/972,258

(22) Filed: Dec. 17, 2015

(65) Prior Publication Data
US 2016/0195804 A1    Jul. 7, 2016

(30) Foreign Application Priority Data
Jan. 7, 2015   (KR) .......................... 10-2015-0002170

(51) Int. Cl.
G03F 1/64    (2012.01)
G03F 1/62    (2012.01)
C23C 16/26   (2006.01)

(52) U.S. Cl.
CPC ................ G03F 1/62 (2013.01); C23C 16/26 (2013.01)

(58) Field of Classification Search
CPC .................................. G03F 1/64; C23C 16/26
See application file for complete search history.

(56) References Cited

U.S. PATENT DOCUMENTS

| | | | |
|---|---|---|---|
| 4,970,099 A | 11/1990 | Adams et al. | |
| 5,168,001 A | 12/1992 | Legare et al. | |
| 6,623,893 B1 | 9/2003 | Levinson et al. | |
| 7,767,985 B2 | 8/2010 | Okoroanyanwu et al. | |
| 2005/0042524 A1 | 2/2005 | Bellman | |
| 2010/0124709 A1 | 5/2010 | Hawtof et al. | |
| 2011/0116068 A1* | 5/2011 | Wilklow | B82Y 10/00 355/67 |
| 2012/0161098 A1* | 6/2012 | Hiura | C23C 16/0218 257/9 |
| 2013/0004711 A1 | 1/2013 | Doi et al. | |
| 2013/0088699 A1 | 4/2013 | Yakunin et al. | |
| 2014/0160455 A1 | 6/2014 | Yakunin et al. | |
| 2015/0309404 A1* | 10/2015 | Lin | G03F 1/62 430/5 |

FOREIGN PATENT DOCUMENTS

| | | |
|---|---|---|
| JP | 2013195950 A | 9/2013 |
| KR | 100849714 B1 | 8/2008 |
| KR | 102013008856 | 8/2013 |

* cited by examiner

*Primary Examiner* — Duy Deo
*Assistant Examiner* — Mahmoud Dahimene
(74) *Attorney, Agent, or Firm* — Harness, Dickey & Pierce, P.L.C.

(57) ABSTRACT

The method includes forming a graphite layer on a substrate, forming a supporting layer on the graphite layer to form a stack of the graphite layer and the supporting layer, removing the substrate to separate the stack from the substrate, transferring the stack of the graphite layer and the supporting layer onto a frame, and removing the supporting layer from the frame.

19 Claims, 15 Drawing Sheets

METHODS OF FABRICATING PELLICLES USING SUPPORTING LAYER

CROSS-REFERENCE TO RELATED APPLICATION

This application claims priority under 35 U.S.C. §119 to Korean Patent Application No. 10-2015-0002170 filed on Jan. 7, 2015, the disclosure of which is hereby incorporated by reference in its entirety.

BACKGROUND

Technical Field

The present disclosure is related to methods of fabricating pellicles for extreme ultra violet (EUV) photolithography processes and to pellicles for the EUV processes fabricated using the methods.

Description of Related Art

Particle contamination can be a significant problem in semiconductor manufacturing. A photomask is protected from particles by a pellicle—a film stretched over a frame that is glued over one side of the photomask.

SUMMARY

Some embodiments of the inventive concepts provide pellicles of reflective reticles used in an extreme ultra violet (EUV) photolithography process.

Some embodiments of the inventive concepts provide methods of fabricating pellicles of reflective reticles used in the extreme ultra violet (EUV) photolithography process.

Some embodiments of the inventive concepts provide free-standing type pellicles having a single graphite layer.

Some embodiments of the inventive concepts provide methods of fabricating free-standing type pellicles having a single graphite layer.

A method of fabricating a pellicle in accordance with an embodiment of the inventive concepts includes forming a graphite layer on a substrate, forming a supporting layer on the graphite layer to form a stack of the graphite layer and the supporting layer, removing the substrate to separate the stack from the substrate, transferring the stack of the graphite layer and the supporting layer onto a frame, and removing the supporting layer from the frame.

A method of fabricating a pellicle in accordance with an embodiment of the inventive concepts includes forming a first supporting layer on a first substrate, forming a graphite layer on a second substrate, removing the first substrate and the second substrate to separate the first supporting layer and the graphite layer from the first substrate and the second substrate, respectively, transferring the first supporting layer onto a frame, transferring the graphite layer onto the first supporting layer transferred onto the frame, and removing an exposed portion of the first supporting layer in an opening of the frame.

A method of fabricating a pellicle in accordance with an embodiment of the inventive concepts includes forming a first supporting layer on a first substrate, forming a graphite layer on a second substrate, forming a second supporting layer on the graphite layer formed on the second substrate to form a stack of the graphite layer and the second supporting layer, separating the first supporting layer from the first substrate, separating the stack of the graphite layer and the second supporting layer from the second substrate, transferring the first supporting layer onto a frame, transferring the stack of the graphite layer and the second supporting layer onto the first supporting layer transferred on the frame, and removing a portion of the first supporting layer and the second supporting layer.

Details of other embodiments are included in detailed explanations and the drawings.

BRIEF DESCRIPTION OF THE DRAWINGS

The foregoing and other features and advantages of the inventive concepts will be apparent from the more particular description of example embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
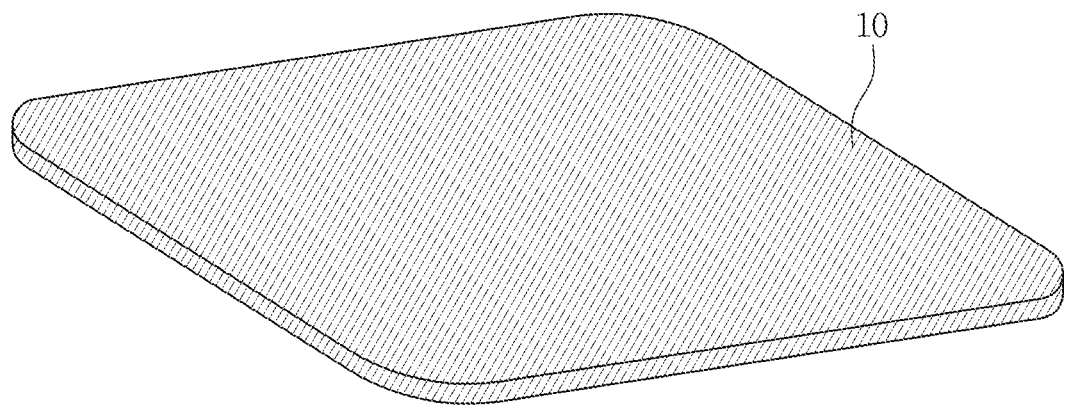
FIGS. 1 to 8 illustrate a method of manufacturing a pellicle in accordance with an embodiment of the inventive concepts.

Various embodiments will now be described more fully with reference to the accompanying drawings in which some embodiments are shown. These inventive concepts may, however, be embodied in different forms and should not be construed as limited to the embodiments set forth herein. Rather, these embodiments are provided so that this disclosure is thorough and complete and fully conveys the inventive concepts to those skilled in the art.

The terminology used herein is for the purpose of describing particular embodiments only and is not intended to be limiting of the inventive concepts. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected, or coupled to the other element or layer or intervening elements or layers may be present. In contrast, when an element is referred to as being "directly on," "directly connected to," or "directly coupled to" another element or layer, there are no intervening elements or layers present. In the following explanation, the same reference numerals denote the same components throughout the specification. As used herein, the term "and/or" includes any and all combinations of one or more of the associated listed items.

Spatially relative terms, such as "beneath," "below," "lower," "above," "upper," and the like, may be used herein for ease of description in describing one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Some example embodiments of the inventive concepts will be described with reference to cross-sectional views and/or plan views, which are ideal example views. Thicknesses of layers and areas are exaggerated for effective description of the technical contents in the drawings. Forms of the embodiments may be modified by the manufacturing technology and/or tolerance. Therefore, the embodiments of the inventive concepts are not intended to be limited to illustrated specific forms, but include modifications of forms generated according to manufacturing processes. For example, an etching area illustrated at a right angle may be round or have a predetermined curvature. Therefore, areas illustrated in the drawings have overview properties, and shapes of the areas are illustrated special forms of the areas of a device, and are not intended to be limited to the scope of the inventive concepts.

Hereinafter, like reference numerals in the drawings denote like elements. Therefore, although like reference numerals or similar reference numerals are not mentioned or described in the drawing, it will be described with reference to the other drawings. Further, although reference numerals are not illustrated, it will be described with reference to the other drawings.

FIGS. 1 to 8 illustrate a method of manufacturing a pellicle in accordance with an embodiment of the inventive concepts.

Referring to FIG. 1, a method of fabricating a pellicle in accordance with an embodiment of the inventive concepts may include providing a catalytic substrate 10. The catalytic substrate 10 may include a metal or a metal compound. For example, the catalytic substrate 10 may include copper (Cu). In another embodiment, the catalytic substrate 10 may include at least one of chrome (Cr), nickel (Ni), ruthenium (Ru), titanium (Ti), tantalum (Ta), aluminum (Al), metal alloys thereof, or a metal compound such as titanium nitride (TiN) or tantalum nitride (TaN). In another embodiment, the catalytic substrate 10 may include a silicon wafer or glass.

Figure 2A:
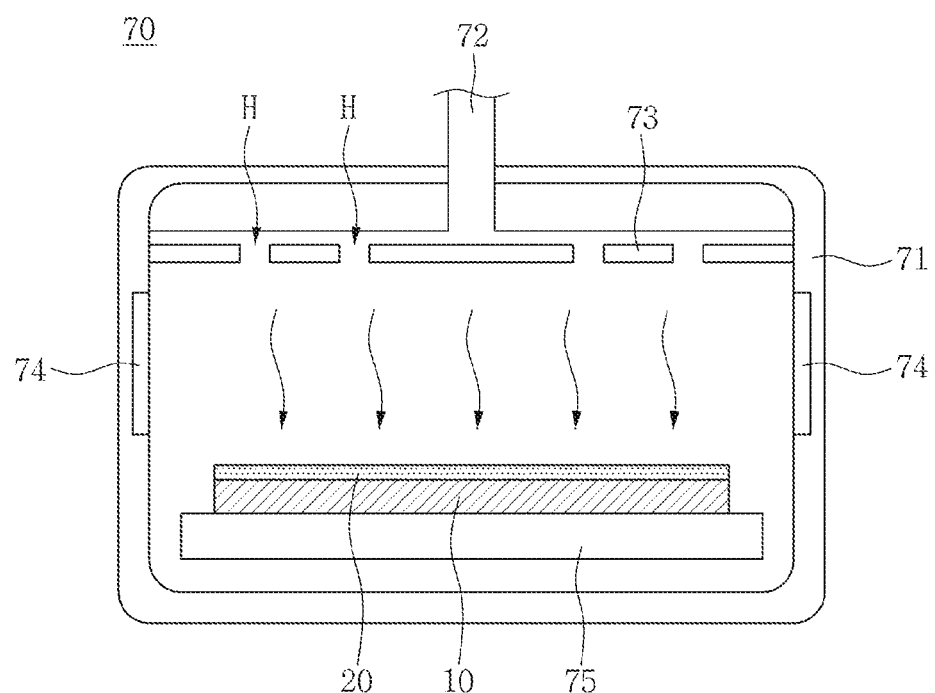
Figure 2B:
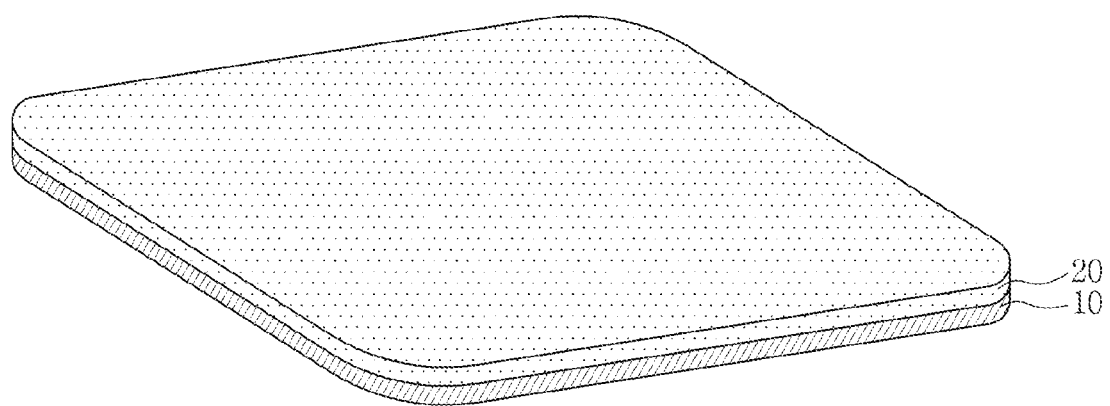

Referring to FIGS. 2A and 2B, the method may include performing a deposition process to form a graphite layer 20 on the catalytic substrate 10. For example, the deposition process may include loading the catalytic substrate 10 into a vacuum chamber 71 of a deposition apparatus 70, and performing a chemical vapor deposition (CVD) process to form the graphite layer 20 on the catalytic substrate 10. The deposition apparatus 70 may include a gas supply tube 72 and a gas distribution plate 73 disposed at an upper part of the vacuum chamber 71, heating lamps 74 disposed on a sidewall of or embedded in the sidewall of the vacuum chamber 71, and a stage 75 disposed at a lower part of the vacuum chamber 71.

In an embodiment, the deposition process may include loading the catalytic substrate 10 on the stage 75, supplying a precursor having carbon (C) or carbide such as methane ($CH_4$) or ethane ($C_2H_6$) in the vacuum chamber 71 through the gas supply tube 72, uniformly distributing the precursor in the vacuum chamber 71 using the gas distribution plate 73, heating the precursor to dissociate the carbon atoms from the precursor using the heating lamps 74, and depositing the dissociated carbon atoms on the catalytic substrate 10 mounted on the stage 75 to form the graphite layer 20. In another embodiment, the precursor may include an organic compound having a functional group including carbon such as a methyl group or an ethyl group. One or more gas supply tubes 72 may be disposed at the upper part or side part of the vacuum chamber 71. The gas distribution plate 73 may have a circular plate shape having a plurality of holes H.

During performing the deposition process, the carbon atoms and the catalytic substrate 10 can be heated such that an inside temperature of the vacuum chamber 71 may increase from the room temperature to about 1,000° C. in about 2 minutes. The graphite layer 20 may have a thickness of about 20 nm according to an embodiment of the inventive concepts. When the graphite layer 20 is thicker than about 20 nm, a transmittance of EUV light of the graphite layer 20 is reduced, and when the graphite layer 20 is thinner than about 20 nm, physical and/or chemical durability of the graphite layer 20 is reduced. Then, the catalytic substrate 10 having the graphite layer 20 deposited thereon may be cooled at the room temperature.

Figure 3A:
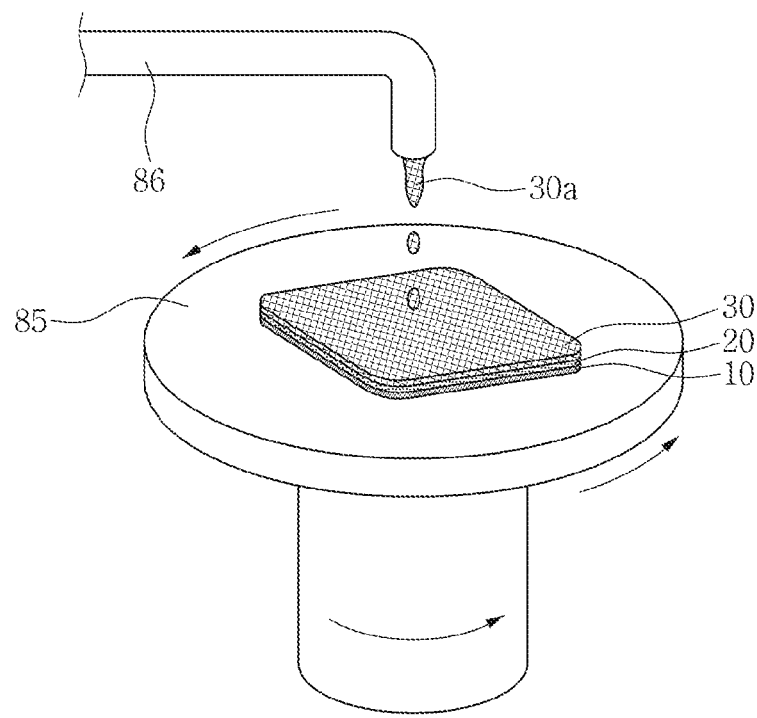
Figure 3B:
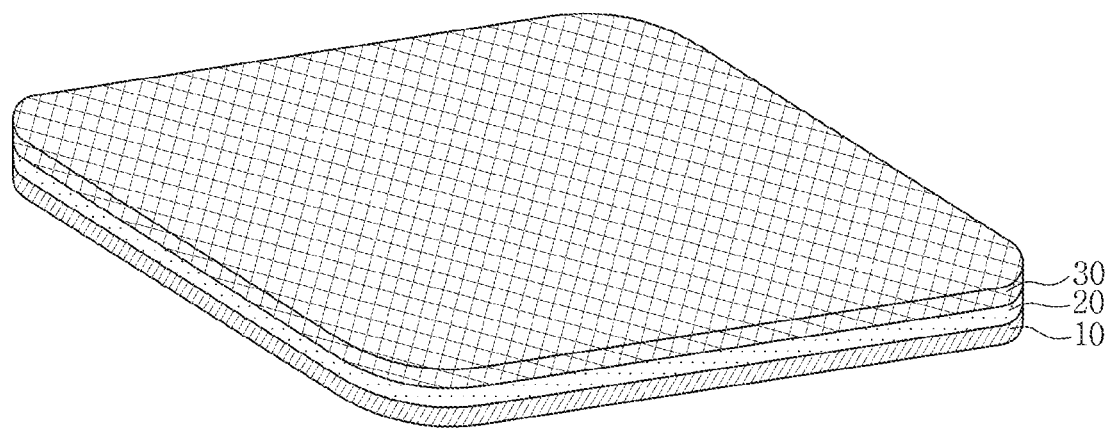

Referring to FIGS. 3A and 3B, the method may include performing a spin coating process to form a supporting layer 30 on the graphite layer 20 to form a stack of the graphite layer 20 and the supporting layer 30. For example, the spin coating process may include mounting the catalytic substrate 10 with the graphite layer 20 thereon on a spin chuck 85, spinning the spin chuck 85, dispersing a liquid supporting material 30a having viscosity on the graphite layer 20 using a nozzle 86, and slowly drying the dispersed supporting material 30a on the graphite layer 20 in a high humidity ambience to form the supporting layer 30. The supporting layer 30 may include an organic polymer such as polymethylmethacrylate (PMMA).

Figure 4:
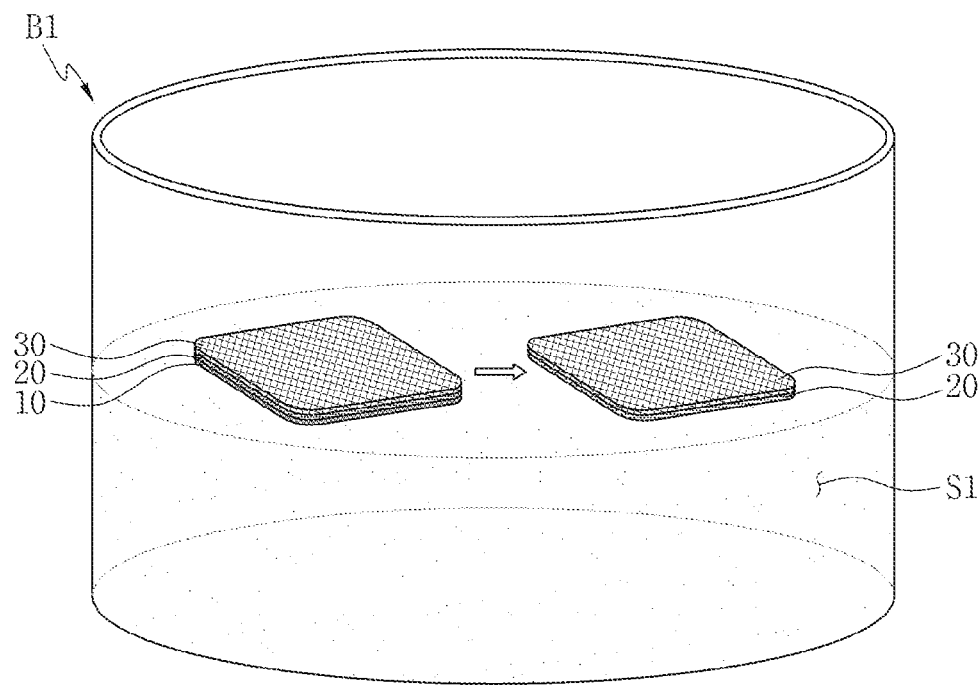

Referring to FIG. 4, the method may include removing the catalytic substrate 10 from the stack of the graphite layer 20 and the supporting layer 30. Removing the catalytic substrate 10 from the stack can be referred to as a separating process. The separating process may include a first wet process according to an embodiment. The first wet process may include dipping the catalytic substrate 10 having the stack of the graphite layer 20 and the supporting layer 30 formed thereon in a first solution S1 in a first bath B1, and removing the catalytic substrate 10. Accordingly, the stack of the graphite layer 20 and the supporting layer 30 may be separated from the catalytic substrate 10. The first solution S1 may include a metal etchant. For example, the first solution S1 may include de-ionized (DI) water containing at least one of ferric chloride ($FeCl_3$) and ceric ammonium nitrate (CAN). In another embodiment, the first solution S1 may include at least one of hydrogen peroxide ($H_2O_2$), phosphoric acid ($H_3PO_4$), nitric acid ($HNO_3$), acetic acid ($C_2H_4O_2$), cyclic amine compound, and DI water.

Figure 5:
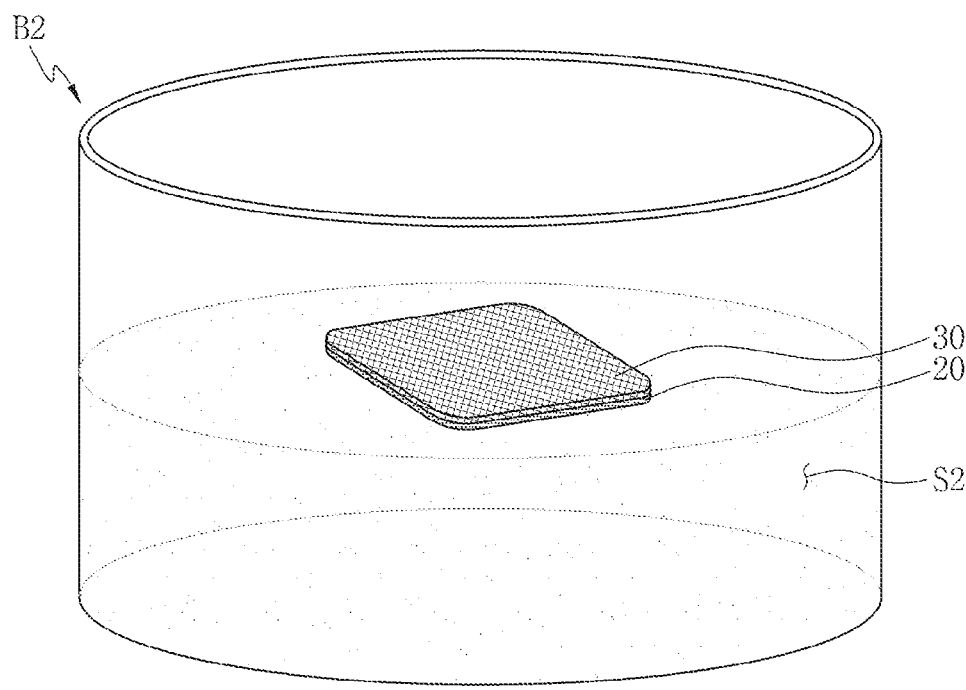

Referring to FIG. 5, the method according to an embodiment may include performing a rinsing process to rinse the separated stack of the graphite layer 20 and the supporting layer 30. The rinsing process may include a second wet process. The second wet process may include dipping or suspending the separated stack of the graphite layer 20 and the supporting layer 30 in or on a second solution S2 in a second bath B1 to rinse the stack of the graphite layer 20 and the supporting layer 30. The second solution S2 may include a rinsing solution. The rinsing solution may include DI water or DI water containing at least one of nitric acid ($HNO_3$) and hydrochloric acid (HCl).

Figure 6:
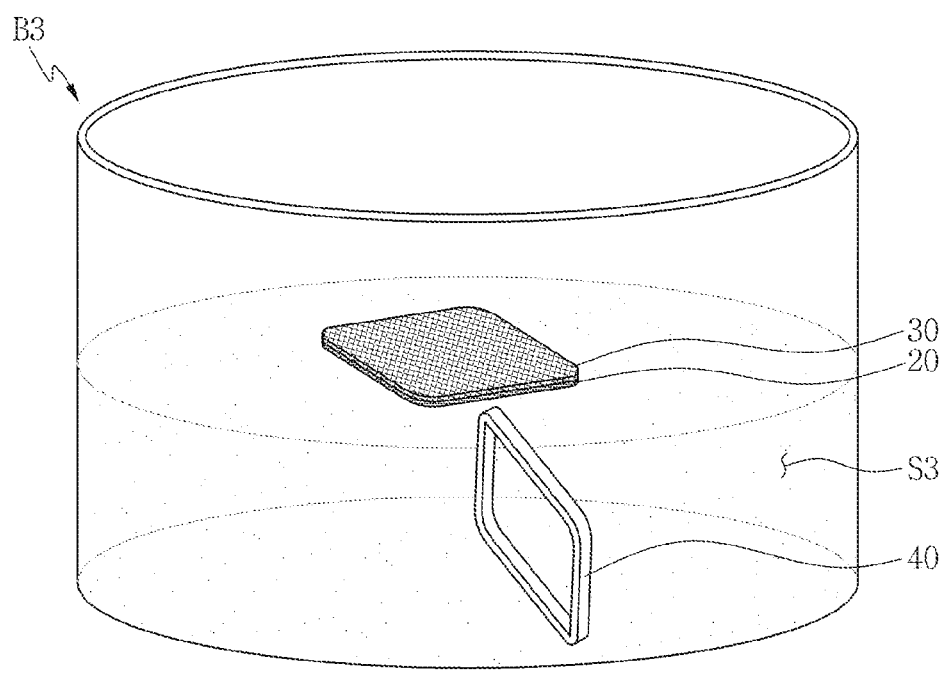

Referring to FIG. 6, the method according to an embodiment may include performing a transferring process to transfer the stack of the graphite layer 20 and the supporting layer 30 onto a frame 40. The transferring process may include a third wet process. The third wet process may include suspending the stack of the graphite layer 20 and the supporting layer 30 on a third solution S3 in a third solution B3, and raising the frame 40 from inside of the third solution S3 to a surface of the third solution S3 to attach the stack of the graphite layer 20 and the supporting layer 30 onto the frame 40.

The third solution S3 may include one of DI water, alcohol, or a mixture thereof. The alcohol may include one of methyl alcohol, ethyl alcohol, or isopropyl alcohol.

In another embodiment, the third solution S3 is the same as the second solution S2. For example, the second solution S2 and the third solution S3 may include DI water. In another embodiment, the third bath B3 is the same as the second bath B2.

The stack may be suspended on the third solution S3 so that the graphite layer 20 faces upward and the supporting layer 30 faces downward. The frame 40 may rise perpendicularly to the stack of the graphite layer 20 and the supporting layer 30. Accordingly, the stack of the graphite layer 20 and the supporting layer 30 may be adhered on an opening of the frame 40 without any wrinkles due to gravity and/or surface tension of the third solution S3. In another embodiment, the frame 40 may rise in a diagonally slanting state having a predetermined angle to the surface of the third solution S3. The frame 40 and the supporting layer 30 may be directly adhered with each other.

Since the graphite layer 20 is hydrophobic, hydrophilic and hydrophobic characteristics of the third solution S3 may be adjusted by appropriately mixing the de-ionized water and the alcohol to spread the graphite layer 20 without any wrinkles. For example, since a surface tension of the de-ionized water is about 72.7 dyne/cm and a surface tension of the alcohol is about 22.4 dyne/cm at room temperature, the de-ionized water and the alcohol may be appropriately mixed to obtain a surface tension at which the graphite layer 20 is appropriately spread.

In an embodiment, the third solution S3 may further include agents having a hydrophilic group or a hydrophobic group. For example, the third solution S3 may further include hydrophilic agents such as aminopropyltriethoxysilane (ATS) or hydrophobic agents such as octadecyltrichlorosilane (OTS).

Figure 7:
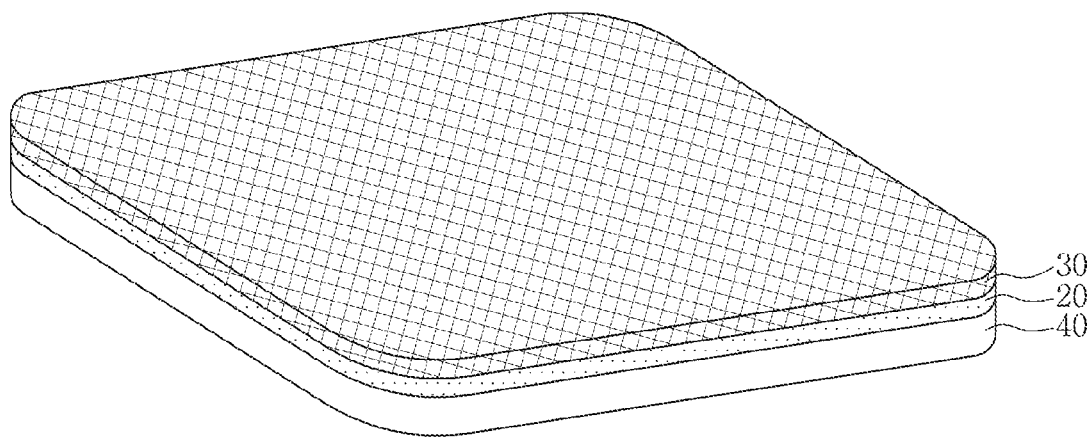

Referring to FIG. 7, the method according to an embodiment may include drying the stack of the graphite layer 20 and the supporting layer 30 adhered on the frame 40 and then completing a preliminary pellicle 50P. The stack of the graphite layer 20 and the supporting layer 30 may be dried using nitrogen ($N_2$). The graphite layer 20 may extend onto an outer wall of the frame 40 to cover a part of the outer wall of the frame 40.

Figure 8:
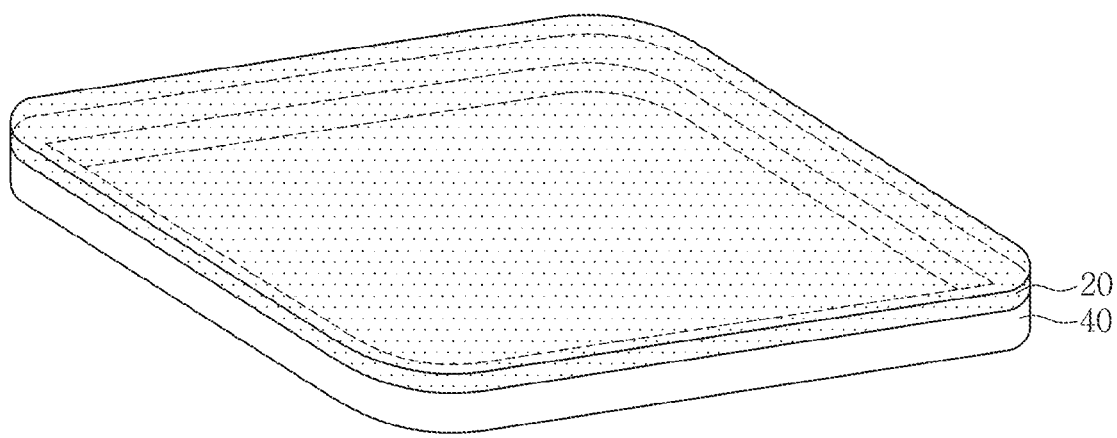

Referring to FIG. 8, the method according to an embodiment may include removing the supporting layer 30 from the preliminary pellicle 50P and then completing a pellicle 50. The supporting layer 30 may be removed using oxygen ($O_2$) plasma according to an embodiment of the present inventive concepts.

Figure 9:
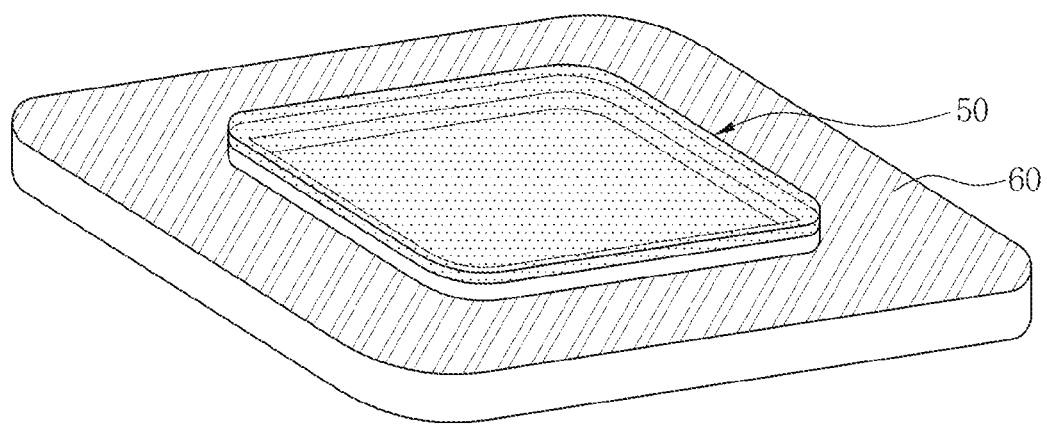
FIG. 9 illustrates a pellicle manufactured according to an embodiment of the inventive concepts.

FIG. 9 is a perspective view illustrating a reticle 60 having the pellicle 50 according to an embodiment adhered thereon. Referring to FIG. 9, the pellicle 50 may be adhered on a pattern side of the reticle 60. Since the graphite layer 20 of the pellicle 50 has a repulsive force against electrons, contaminations, defects, or damages by electrostatic particles can be reduced or minimized.

FIGS. 10 to 16 illustrate a method of manufacturing a pellicle in accordance with an embodiment of the inventive concepts.

Figure 10:
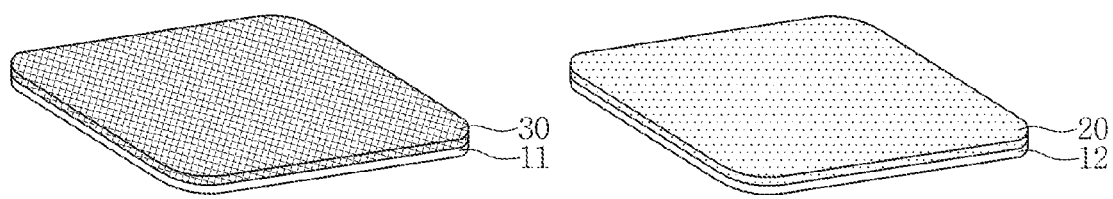
FIGS. 10 to 15 illustrate methods of manufacturing pellicles in accordance with some embodiments of the inventive concepts.

Referring to FIG. 10, a method of fabricating a pellicle in accordance with an embodiment of the inventive concepts may include performing the processes described with reference to FIGS. 1, 3A, and 3B to form a supporting layer 30 on a first catalytic substrate 11, and performing the processes described with reference to FIGS. 1, 2A, and 2B to form a graphite layer 20 on a second catalytic substrate 12. Each the first catalytic substrate 11 and the second catalytic substrate 12 may include at least one of copper (Cu), chrome (Cr), nickel (Ni), ruthenium (Ru), titanium (Ti), tantalum (Ta), aluminum (Al), titanium nitride TiN), tantalum nitride (TaN), a silicon wafer, or glass.

Figure 11:
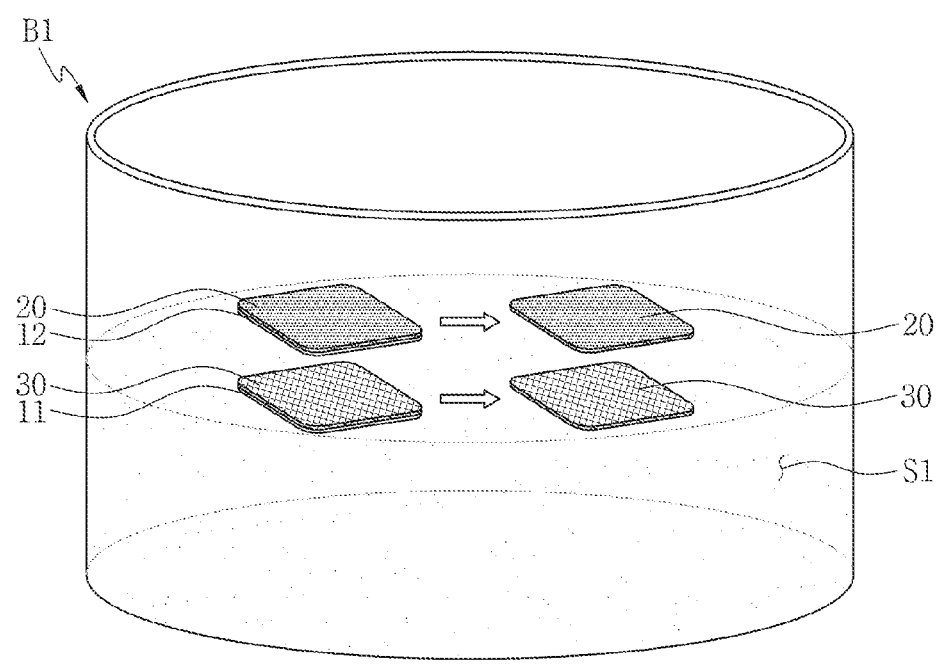

Referring to FIG. 11, the method according to an embodiment may include performing the process described with reference to FIG. 4 to remove the first catalytic substrate 11 and the second catalytic substrate 12 to separate the supporting layer 30 and the graphite layer 20 from the first catalytic substrate 11 and the second catalytic substrate 12, respectively.

Figure 12:
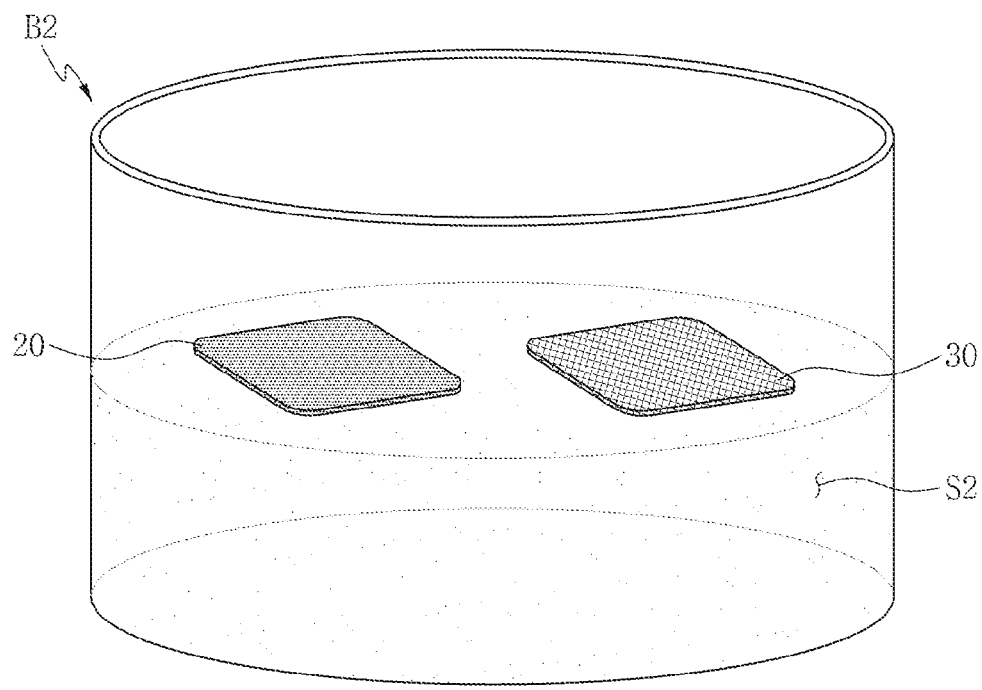

Referring to FIG. 12, the method may include performing the process described with reference to FIG. 5 to rinse the graphite layer 20 and the supporting layer 30, respectively.

Figure 13:
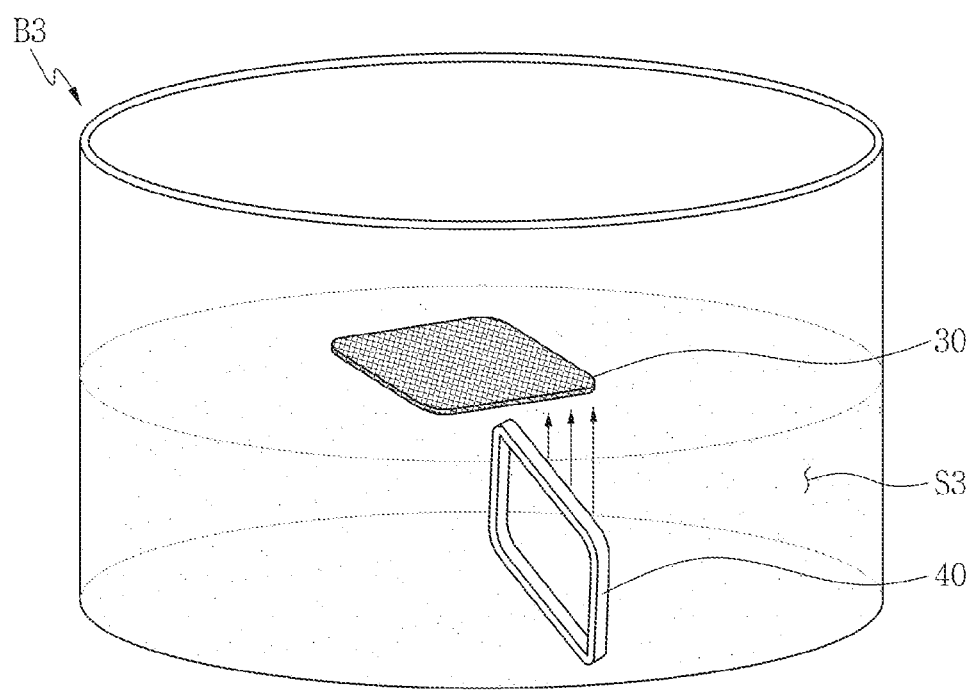

Referring to FIGS. 13 and 6, the method may include performing a first transfer process to transfer the supporting layer 30 onto a frame 40.

Figure 14:
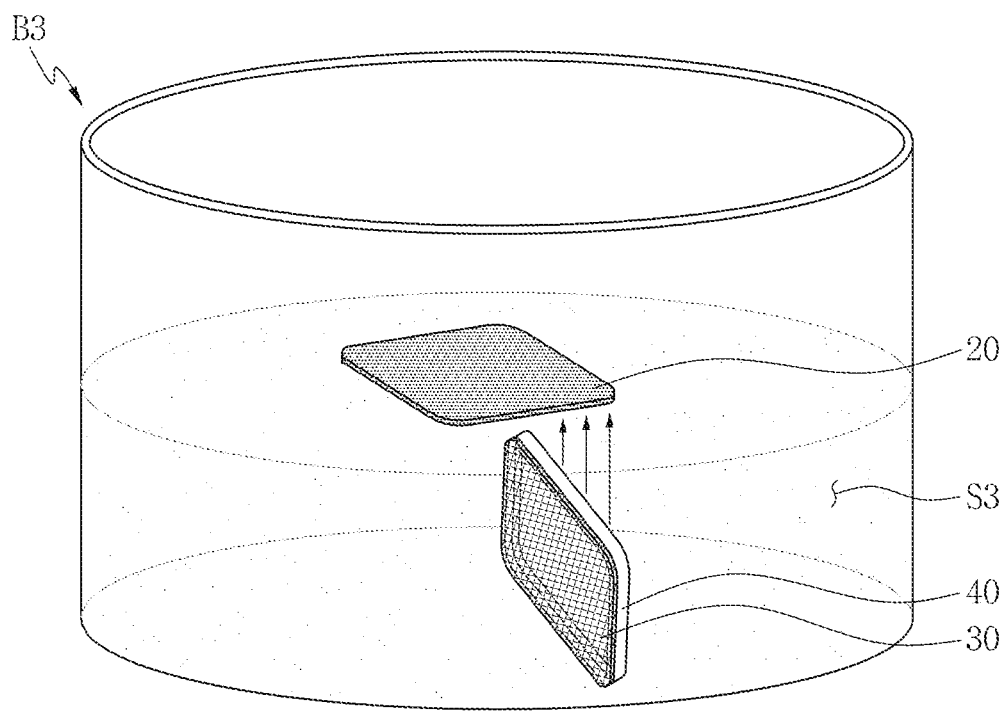

Referring to FIGS. 14 and 6, the method may include performing a second transfer process to transfer the graphite layer 20 onto the supporting layer 30 on the frame 40.

Figure 15:
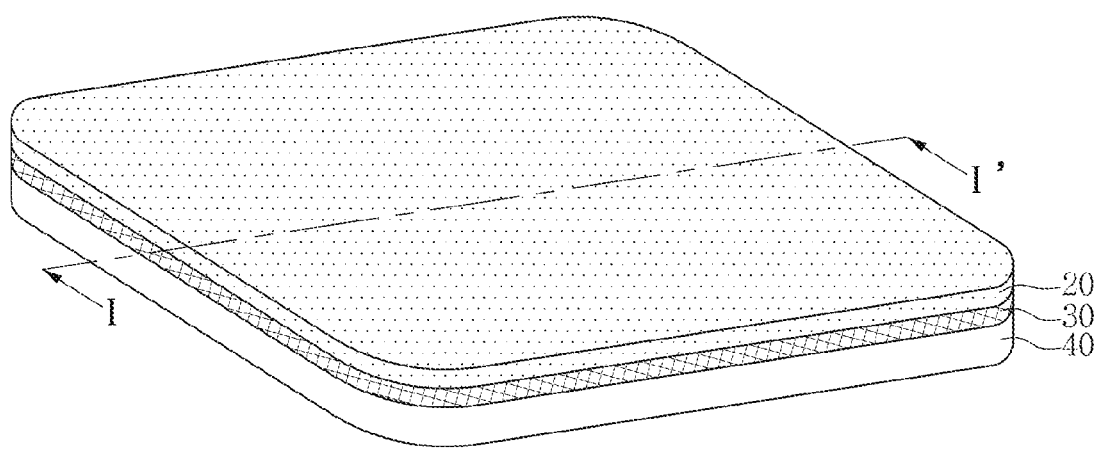

Referring to FIGS. 15 and 7, the method may include performing a dry process to dry a stack of the graphite layer 20 and the supporting layer 30.

Figure 16:
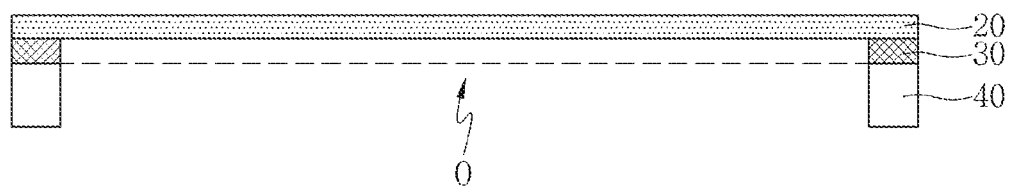
FIG. 16 is a cross-sectional view taken along the line I-I' in FIG. 15.

FIG. 16 is a cross-sectional view taken along the line I-I' in FIG. 15. Referring to FIG. 16, the method may include performing the process described with reference to FIG. 8 to remove exposed portions of the supporting layer 30 in an opening of the frame 40 using oxygen ($O_2$) plasma. The removed supporting layer 30 is indicated by a dotted line. Portions of the supporting layer 30 which are attached to the frame 40 may not be removed and may remain.

FIGS. 17 to 22 illustrate a method of manufacturing a pellicle in accordance with an embodiment of the inventive concepts.

Figure 17:
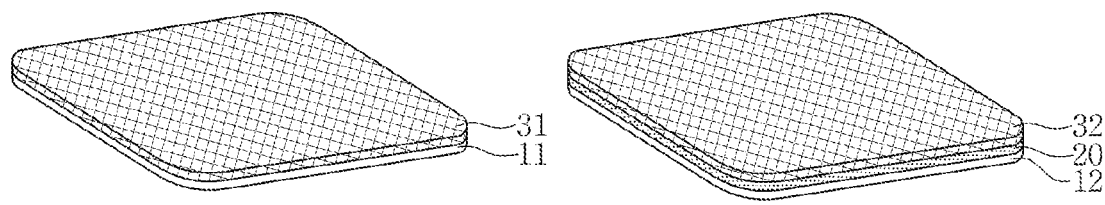
FIGS. 17 to 22 illustrate methods of manufacturing pellicles in accordance with some embodiments of the inventive concepts.

Referring to FIG. 17, the method of manufacturing a pellicle in accordance with an embodiment of the inventive concepts may include performing the processes with reference to FIGS. 1, 3A, and 3B to form a first supporting layer 31 on a first catalytic substrate 11, and performing the processes with reference to FIGS. 1, 2A, 2B, 3A, and 3B to form a graphite layer 20 on a second catalytic substrate 12 and form a second supporting layer 32 on the graphite layer 20.

Figure 18:
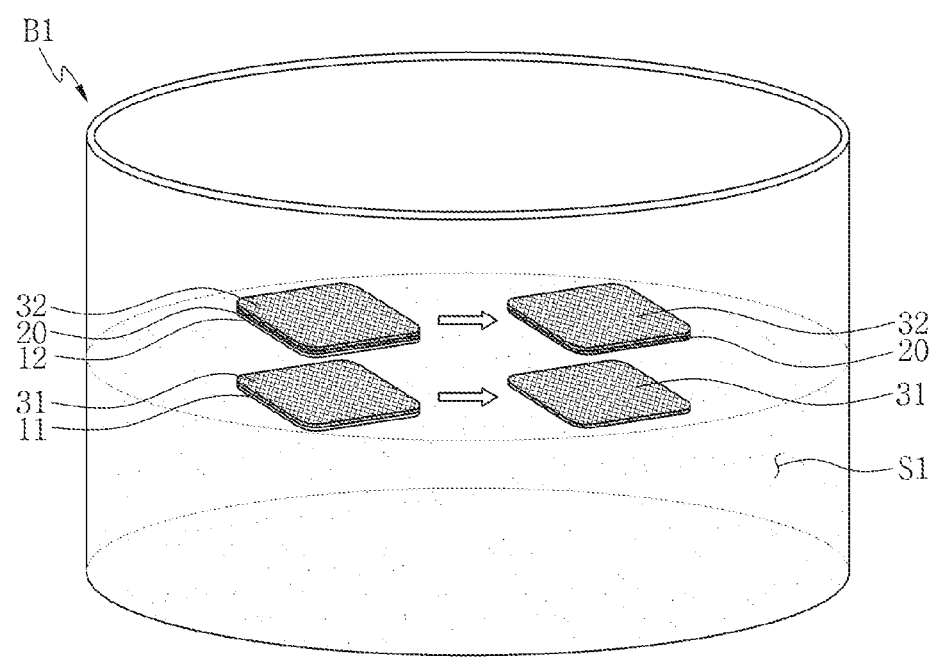

Referring FIG. 18, the method may include performing the process described with reference to FIG. 4 to remove the first catalytic substrate 11 and the second catalytic substrate 12 to separate the first supporting layer 31, a stack of the graphite layer 20 and the second supporting layer 32, respectively.

Figure 19:
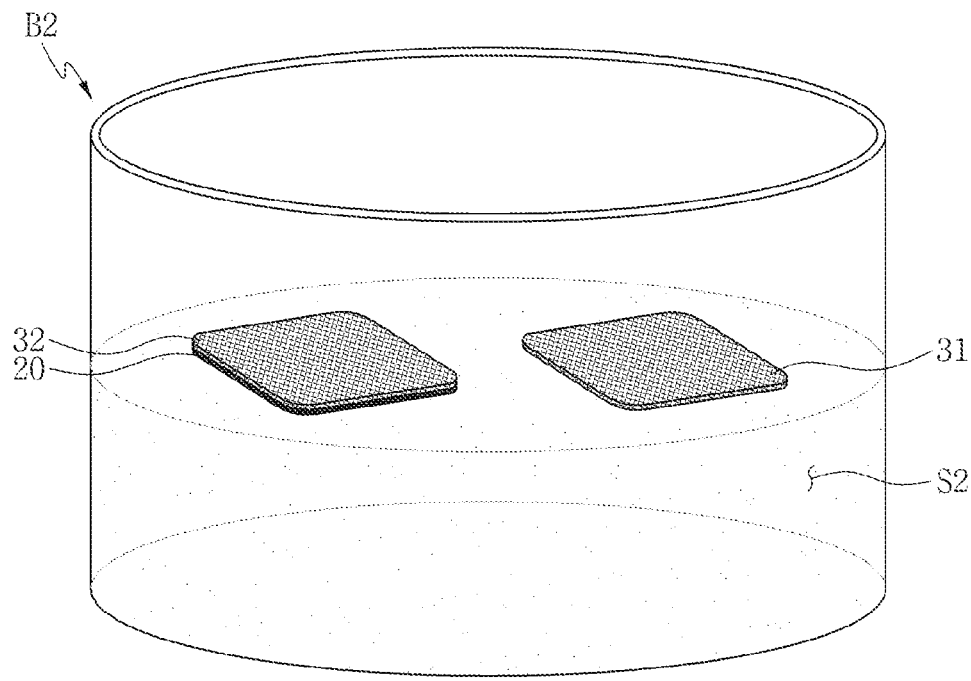

Referring to FIG. 19, the method may include performing the process described with reference to FIG. 5 to rinse the first supporting layer 31, and the stack of the graphite layer 20 and the second supporting layer 32, respectively.

Figure 20:
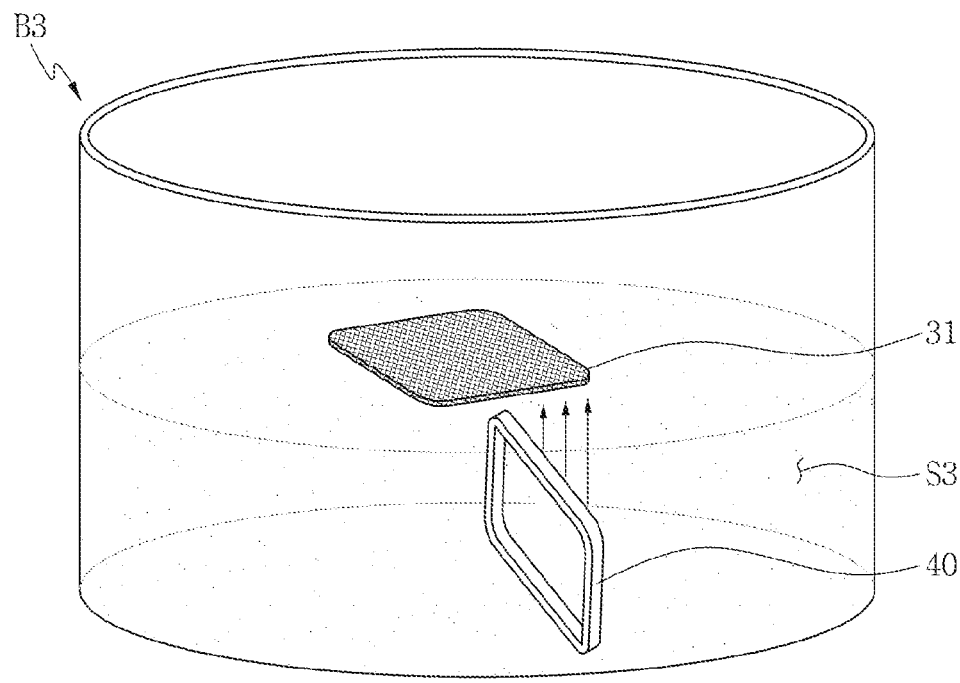

Referring to FIG. 20, the method may include performing the process described with reference to FIG. 6 to transfer the first supporting layer 31 onto the frame 40.

Figure 21:
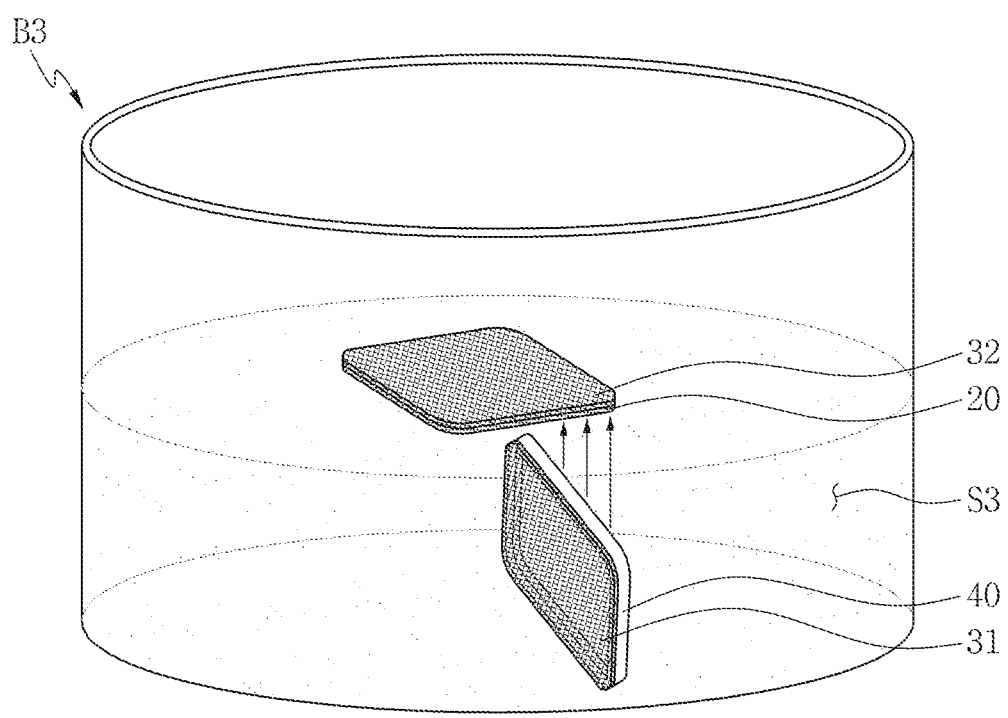

Referring to FIG. 21, the method may include performing the process described with reference to FIG. 6 to transfer the stack of the graphite layer 20 and the second supporting layer 32 onto the first supporting layer 31 transferred on the frame 40.

Figure 22:
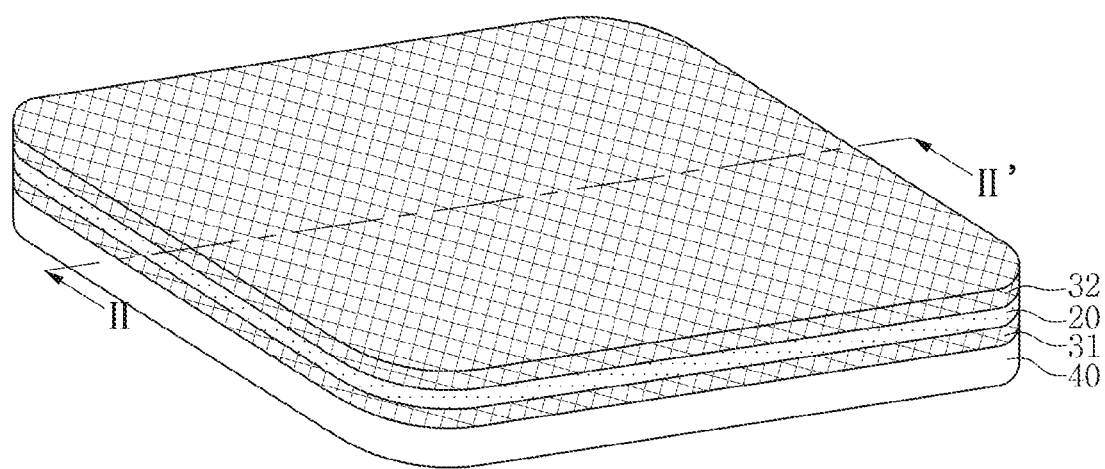

Referring to FIG. 22, the method may include performing the process described with reference to FIG. 7 to dry the first supporting layer 31, and the stack of the graphite layer 20 and the second supporting layer 32.

Figure 23:
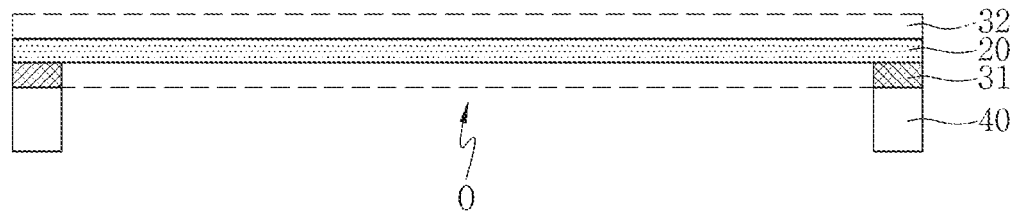
FIG. 23 is a cross-sectional view taken along the line II-II' in FIG. 22.

FIG. 23 is a cross-sectional view taken along line in FIG. 22. Referring to FIG. 23, the method may include performing the process described with reference to FIG. 8 to remove exposed portions of the first supporting layer 31 and the second supporting layer 32 in an opening of the frame 40 using oxygen ($O_2$) plasma. The removed portions of the first supporting layer 31 and the second supporting layer 32 are indicated by dotted lines.

Figure 24:
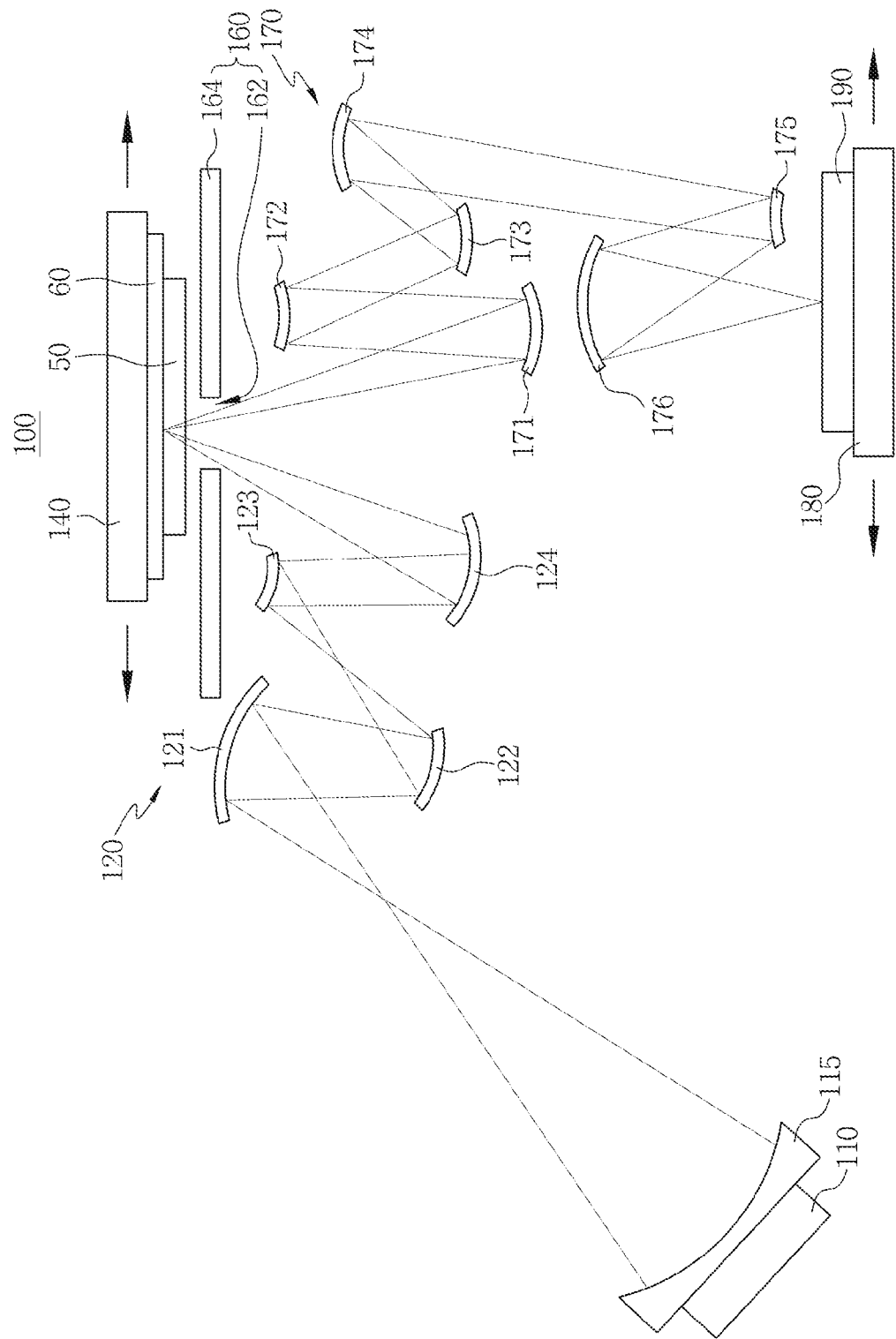
FIG. 24 is a conceptual view showing performing of a reflective photolithography process using a reticle onto which a pellicle in accordance with an embodiment of the inventive concepts is attached.

FIG. 24 is a conceptual view showing performing of a reflective photolithography process using the reticle 60 onto which the pellicle 50 in accordance with the embodiment of the inventive concepts is attached.

Referring to FIG. 24, a method of performing a reflective photolithography process using the reticle 60 having the pellicle 50 attached thereon according to embodiments of the inventive concepts may include providing a reflective photolithography system 100 including a light source 110, an illumination mirror system 120, a reticle stage 140, a blinder 160, a projection mirror system 170, and a wafer stage 180, and installing the reticle 60 having the pellicle 50 attached thereon to face downwardly on the reticle stage 140.

The light source 110 may generate Extreme Ultra Violet (EUV) light. For example, the light source 110 may generate light having a wavelength of about 13.5 nm, for example, the EUV light, using carbon plasma. The light source 110 may include a light collector 115. The light collector 115 may collect and adjust the EUV light generated from the light source 110 to propagate linearly in any one direction. For example, the EUV light generated from the light source 110 may be irradiated to the illumination mirror system 120 through the light collector 115.

The illumination mirror system 120 may include a plurality of illumination mirrors 121 to 124. For example, the illumination mirrors 121 to 124 may condense the EUV light in order to reduce loss of the EUV light which propagates out of the mirrored irradiating paths. Further, for example, the illumination mirrors 121 to 124 may uniformly adjust an overall intensity distribution of the EUV light. Therefore, each of the plurality of illumination mirrors 121 to 124 may include a concave mirror and/or a convex mirror in order to diversify the path of the EUV light. Further, the illumination mirror system 120 may form the EUV light to a square shape, a circular shape, a bar shape, or the like to transfer the formed EUV light to the reticle stage 140.

The reticle stage 140 may mount the reticle 60 on a lower surface thereof and may move in a horizontal direction. For example, the reticle stage 140 may move in directions of the arrows. The reticle stage 140 may include an electrostatic chuck (ESC). The reticle 60 may include optical patterns on one surface thereof. The reticle 60 may be mounted on the lower surface of the reticle stage 140 so that the surface on which the optical patterns are formed faces downward.

The blinder 160 may be disposed under the reticle stage 140. The blinder 160 may include a slit 162 and a plate 164. The slit 162 may have an aperture shape. The slit 162 may form a shape of the EUV light transferred from the illumination mirror system 120 to the reticle 60 mounted on the reticle stage 140. The EUV light transferred from the illumination mirror system 120 may be irradiated to the reticle 60 mounted on the reticle stage 140 through the slit 162. The EUV light reflected from the reticle 60 mounted on the reticle stage 140 may be transferred to the projection mirror system 170 through the slit 162. The plate 164 may block the EUV light irradiated into a region other than the slit 162. Therefore, the blinder 160 may pass some of the EUV light through the slit 162 and block some of the EUV light using the plate 164. Further, the EUV light reflected from the reticle 60 mounted on the lower surface of the reticle stage 140 may pass through the slit 162.

The projection mirror system 170 may receive the EUV light, which is reflected from the reticle 60 and passes through the slit 162, and then may transfer the received EUV light to a wafer 190. The projection mirror system 170 may also include a plurality of projection mirrors 171 to 176. The EUV light which is irradiated onto the wafer 190 by the projection mirrors 171 to 176 may include hypothetical aerial image information of the optical patterns of the reticle 60. The EUV light irradiated onto the wafer 190 may have a shape which is formed by the slit 162. The plurality of projection mirrors 171 to 176 may correct various aberrations.

The wafer stage 180 may receive the wafer 190 and move in a horizontal direction. For example, the wafer stage 180 may move in directions of the arrows. The wafer stage 180 may simultaneously move in the same direction as the reticle stage 140 at a predetermined ratio. For example, in the case in which a movement ratio is 10:1 (10%), when the reticle stage 140 moves 10 μm to the left or right, the wafer stage 180 may move 1 μm in the same direction. In the case in which the movement ratio is 5:1 (20%), when the reticle stage 140 moves 10 μm to the left or right by, the wafer stage 180 may move 2 μm in the same direction. The movement ratio may be variously set. For example, the wafer stage 180 may move in a step and scan method. A focus of the EUV light irradiated from the projection mirror system 170 may be located on a surface of the water 190. For example, a photoresist layer may be formed to have a predetermined thickness on the wafer 190, and the focus of the EUV light may be located in the photoresist layer.

The pellicles in accordance with the embodiments of the inventive concepts include a graphite layer as a membrane layer. Accordingly, physical durability and chemical durability of the pellicles at the EUV photolithography process can be improved.

The pellicles in accordance with the embodiments of the inventive concepts are free-standing type pellicles having a substantially thin single-layered graphite layer. Accordingly, the pellicles can have a high light transmittance at the EUV photolithography process.

A graphite layer of the pellicles in accordance with the embodiments of the inventive concepts can have repulsive force against electrons. Accordingly, contaminations, defects, and damages by electronic particles can be reduced or minimized.

The pellicles in accordance with the embodiments of the inventive concepts have a graphite layer transferred on a frame using a supporting layer. Accordingly, the graphite layer can be transferred on the frame without any wrinkles.

The pellicles in accordance with the embodiments of the inventive concepts have a graphite layer transferred on a frame by raising the frame perpendicular to the graphite layer. Accordingly, the graphite layer can be transferred on the frame without any wrinkles.

Although a few embodiments have been described, those skilled in the art will readily appreciate that many modifications are possible in embodiments without materially departing from the novel teachings and advantages. Accordingly, all such modifications are intended to be included within the scope of this inventive concepts as defined in the claims.

What is claimed is:

1. A method of fabricating a pellicle, the method comprising:
    forming a graphite layer on a substrate;
    forming a supporting layer on the graphite layer to form a stack of the graphite layer and the supporting layer;
    removing the substrate from the stack of the graphite layer and the supporting layer;
    transferring the stack of the graphite layer and the supporting layer onto a frame; and
    removing the supporting layer from the frame,
    wherein the transferring includes:
        suspending the stack on a solution containing water; and
        raising the frame from inside of the solution to a surface of the solution perpendicular to the stack.

2. The method of claim 1, wherein the supporting layer comprises an organic polymer.

3. The method of claim 2, wherein the organic polymer comprises PMMA (polymethylmethacrylate).

4. The method of claim 1, wherein the forming a supporting layer comprises performing a spin coating process.

5. The method of claim 1, wherein the removing the supporting layer comprises using oxygen plasma.

6. The method of claim 1, wherein the forming a graphite layer comprises:
    loading the substrate on a stage in a chamber; and
    performing a chemical vapor deposition (CVD) process to form the graphite layer on the substrate.

7. The method of claim 6, wherein the CVD process comprises:
    using a precursor having at least one of methane ($CH_4$) or ethane ($C_2H_6$); and
    heating the substrate and the precursor to raise a temperature of the substrate and the precursor from room temperature to about 1,000° C. in about 2 minutes using a heating lamp.

8. The method of claim 1, wherein the substrate comprises at least one of copper (Cu), chrome (Cr), nickel (Ni), ruthenium (Ru), titanium (Ti), tantalum (Ta), aluminum (Al), titanium nitride (TiN), tantalum nitride (TaN), silicon wafer, or glass.

9. The method of claim 1, wherein the removing the substrate comprises:
    dipping the substrate having the stack of the graphite layer and the supporting layer formed therein in a metal etchant containing at least one of $FeCl_3$ or ceric ammonium nitrate (CAN), and water.

10. The method of claim 1, wherein the graphite layer and the frame are directly adhered with each other.

11. A method of fabricating a pellicle, the method comprising:
    forming a first supporting layer on a first substrate;
    forming a graphite layer on a second substrate;
    removing the first substrate and the second substrate to separate the first supporting layer and the graphite layer from the first substrate and the second substrate, respectively;
    transferring the first supporting layer onto a frame;
    transferring the graphite layer onto the first supporting layer transferred onto the frame; and
    removing an exposed portion of the first supporting layer in an opening of the frame.

12. The method of claim 11, wherein
    the first supporting layer and the frame are directly adhered with each other, and
    a portion of the first supporting layer adhered to the frame is not removed.

13. The method of claim 11, further comprising:
    forming a second supporting layer on the graphite layer on the second substrate; and
    removing the second supporting layer,
    wherein the removing an exposed portion of the first supporting layer and the removing the second supporting layer are independently performed.

14. The method of claim 11, wherein
    the transferring the first supporting layer onto the frame comprises suspending the first supporting layer on a surface of a solution, and raising the frame from inside of the solution to the surface of the solution perpendicular to the surface of the solution, and
    the transferring the graphite layer onto the first supporting layer on the frame comprises suspending the graphite layer on the surface of the solution, and raising the frame having the first supporting layer transferred thereon from the inside of the solution to the surface of the solution perpendicular to the surface of the solution.

15. A method of fabricating a pellicle, the method comprising:
    forming a first supporting layer on a first substrate;
    forming a graphite layer on a second substrate;
    forming a second supporting layer on the graphite layer formed on the second substrate to form a stack of the graphite layer and the second supporting layer;
    separating the first supporting layer from the first substrate;
    separating the stack of the graphite layer and the second supporting layer from the second substrate;
    transferring the first supporting layer onto a frame;
    transferring the stack of the graphite layer and the second supporting layer onto the first supporting layer transferred on the frame; and
    removing a portion of the first supporting layer and the second supporting layer.

16. The method of claim 15, further comprising:
    rinsing the separated first supporting layer and the stack of the graphite layer and the second supporting layer using a rinsing solution containing water.

17. The method of claim 15, further comprising:
    drying the separated first supporting layer and the stack of the graphite layer and the second supporting layer transferred on the frame using nitrogen ($N_2$).

18. The method of claim 15,
    wherein the first supporting layer and the graphite layer are directly adhered with each other.

19. The method of claim 15, wherein removing the portion of the first supporting layer and the second supporting layer comprises a first removing process to remove the portion of the first supporting layer and a second removing process to remove the second supporting layer.

* * * * *